United States Patent
Gil

(12) United States Patent (10) Patent No.: US 7,592,260 B2
(45) Date of Patent: Sep. 22, 2009

(54) METHOD OF MANUFACTURING A SEMICONDUCTOR DEVICE

(75) Inventor: Min Chul Gil, Busan (KR)

(73) Assignee: Hynix Semiconductor Inc., Icheon-Si (KR)

( * ) Notice: Subject to any disclaimer, the term of this patent is extended or adjusted under 35 U.S.C. 154(b) by 320 days.

(21) Appl. No.: 11/749,240

(22) Filed: May 16, 2007

(65) Prior Publication Data
US 2008/0057735 A1    Mar. 6, 2008

(30) Foreign Application Priority Data
Sep. 6, 2006  (KR) .................. 10-2006-0085730

(51) Int. Cl.
*H01L 21/302* (2006.01)
(52) U.S. Cl. ................ 438/689; 257/E21.017
(58) Field of Classification Search ................ 438/763, 438/698, 8; 257/E21.02, E21.017, E21.219, 257/E21.245, E21.246
See application file for complete search history.

(56) References Cited

U.S. PATENT DOCUMENTS

| | | | |
|---|---|---|---|
| 7,001,821 B2 * | 2/2006 | Aggarwal et al. ............ 438/396 |
| 7,253,118 B2 * | 8/2007 | Tran et al. ................... 438/717 |
| 7,482,279 B2 * | 1/2009 | Lee ............................ 438/725 |
| 2002/0173163 A1 * | 11/2002 | Gutsche ...................... 438/736 |
| 2003/0180968 A1 * | 9/2003 | Nallan et al. ................... 438/3 |
| 2004/0127037 A1 * | 7/2004 | Lee ............................. 438/689 |
| 2006/0124587 A1 * | 6/2006 | Lee .............................. 216/47 |
| 2007/0037101 A1 * | 2/2007 | Morioka ..................... 430/313 |
| 2007/0049032 A1 * | 3/2007 | Abatchev et al. ............ 438/691 |
| 2007/0148984 A1 * | 6/2007 | Abatchev et al. ............ 438/725 |

FOREIGN PATENT DOCUMENTS

| JP | 2006-228986 | 8/2006 |
|---|---|---|
| KR | 10-2005-0098546 | 10/2005 |
| KR | 10-2006-0056078 | 5/2006 |

* cited by examiner

*Primary Examiner*—Thao P. Le
(74) *Attorney, Agent, or Firm*—Marshall, Gerstein & Borun LLP

(57) ABSTRACT

A method of manufacturing a semiconductor device, wherein an interlayer insulating layer, a lower barrier metal layer, a metal layer having a low resisvitity value, an upper barrier metal layer, a first oxynitride layer, a hard mask layer formed at low temperature, a second oxynitride layer, and an organic Bottom Anti-Reflective Coating (BARC) layer are formed over a semiconductor substrate. The BARC layer, the second oxynitride layer, and the hard mask layer are etched. The first oxynitride layer, the upper barrier metal layer, the metal layer, and the lower barrier metal layer are etched using the hard mask layer as a mask.

5 Claims, 2 Drawing Sheets

METHOD OF MANUFACTURING A SEMICONDUCTOR DEVICE

CROSS-REFERENCE TO RELATED APPLICATION

The priority of Korean patent application number 10-2006-85730, filed on Sep. 6, 2006, the disclosure of which is incorporated by reference in its entirety, is claimed.

BACKGROUND OF THE INVENTION

The invention relates, in general, to semiconductor devices and, more particularly, to a method of manufacturing a semiconductor device, in which bit lines are formed from aluminum (Al) with a low resistivity, thereby decreasing sheet resistance Rs and solving a RC delay problem.

As devices are more highly integrated, the space between bit lines decreases due to a reduction in the design rule, making it difficult to secure a capacitance value between the bit lines. To secure the capacitance value, a Reactive Ion Etching (RIE) method is used when forming the bit lines in order to lower the height of the bit line.

However, the resistance value is increased due to the lowered height of the bit line, and the capacitance value is increased due to the decreased width of the bit line. Accordingly, the sheet resistance Rs of the bit line increases, RC delay occurs, and the signal operating speed reduces.

BRIEF SUMMARY OF THE INVENTION

Accordingly, the invention addresses the above problems, and provides a method of manufacturing a semiconductor device, in which bit lines are formed from aluminum (Al) with a low resistivity, thereby decreasing the sheet resistance Rs and solving a RC delay problem.

A method of manufacturing a semiconductor device includes the steps of forming an interlayer insulating layer, a lower barrier metal layer, a metal layer having a low R resistivity value, an upper barrier metal layer, a first oxynitride layer, a hard mask layer formed at low temperature, a second oxynitride layer, and an organic Bottom Anti-Reflective Coating (BARC) layer over a semiconductor substrate, etching the BARC layer, the second oxynitride layer and the hard mask layer, and etching the first oxynitride layer, the upper barrier metal layer, the metal layer and the lower barrier metal layer by using the hard mask layer as a mask.

DESCRIPTION OF SPECIFIC EMBODIMENTS

A specific embodiment according to the invention is described below with reference to the accompanying drawings.

FIGS. 1A to 1D are cross-sectional views illustrating a method of manufacturing a semiconductor device according to an embodiment of the invention.

Figure 1A:
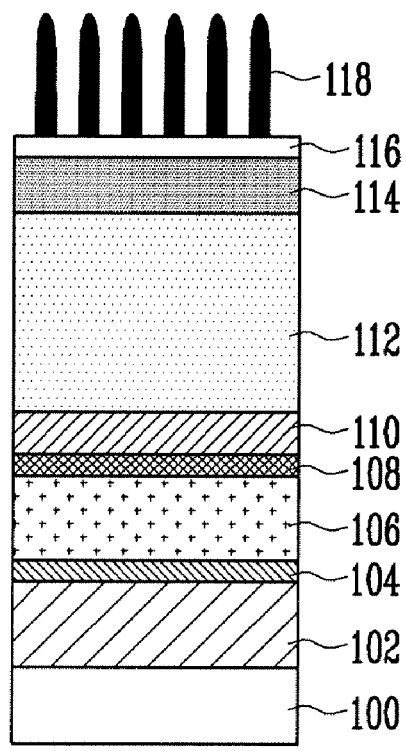
FIGS. 1A to 1D are cross-sectional views illustrating a method of manufacturing a semiconductor device according to an embodiment of the invention.

Referring to FIG. 1A, an interlayer insulating layer 102, a lower barrier metal layer 104, and a metal layer 106 are sequentially formed over a semiconductor substrate 100 in which structures, such as an isolation layer, a gate, a source contact plug, and a drain contact plug, are formed. The interlayer insulating layer 102 or preferably formed from an oxide layer, and the metal layer 106 is preferably formed from aluminum (Al) having a resistivity value of 2.75 µΩ·cm.

An upper barrier metal layer 108, a first oxynitride (SiON) layer 110, and a hard mask layer 112 are sequentially formed over the metal layer 106. The hard mask layer 112 is preferably formed from an amorphous carbon layer to a thickness of 1000 angstroms to 2000 angstroms at a temperature of 200° C. to 500° C. In order for the metal layer 106 not to be influenced, the amorphous carbon layer constituting the hard mask layer 112 is formed at low temperature.

A second oxynitride layer 114, an organic Bottom Anti-Reflective Coating (BARC) layer 116, and a photoresist pattern 118 are sequentially formed over the hard mask layer 112. The photoresist pattern 118 can be formed using ArF.

Figure 1B:
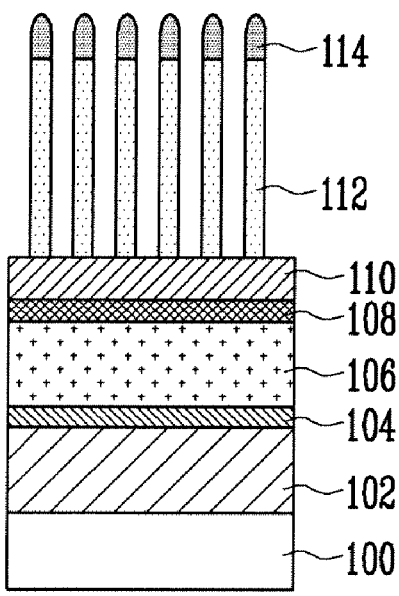

Referring to FIG. 1B, after the BARC layer 116 and the second oxynitride layer 114 are sequentially etched using the photoresist pattern 118 as a mask, the hard mask layer 112 is etched by using the remaining photoresist pattern 118, the etched BARC layer 116, and the second oxynitride layer 114 as a mask. At the time of the etch process of the hard mask layer 112, the photoresist pattern 118, and the BARC layer 116 are all removed, and the second oxynitride layer 114 has its top surface partially removed.

Figure 1C:
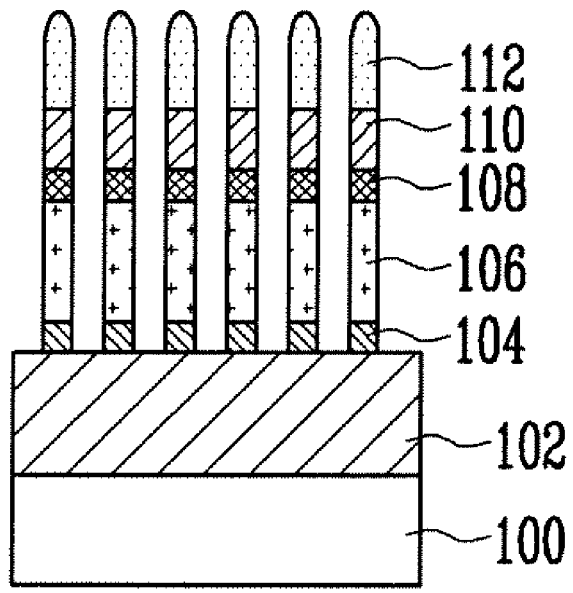

Referring to FIG. 1C, the first oxynitride layer 110, the upper barrier metal layer 108, the metal layer 106, and the lower barrier metal layer 104 are sequentially etched using the hard mask layer 112 as a mask. At the time of the etch process, a portion of the hard mask layer 112 remains. The etch process of the first oxynitride layer 110, the upper barrier metal layer 108, the metal layer 106 and the lower barrier metal layer 104, for forming bit lines is performed in-situ.

Figure 1D:
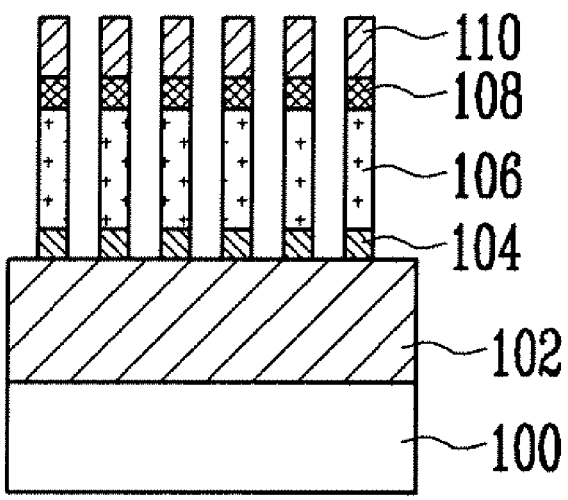

Referring to FIG. 1D, after the remaining hard mask layer 112 is removed, a solvent cleaning process is performed to form the bit lines.

As described above, the metal layer 106 is preferably formed from aluminum (Al) having a resistivity value of 2.75 µΩ·cm. The amorphous carbon layer constituting the hard mask layer 110 is preferably formed at low temperature, which does not influence aluminum (Al). The first oxynitride layer 110, the upper barrier metal layer 108, the metal layer 106, and the lower barrier metal layer 104 are sequentially etched using the amorphous carbon layer as a mask, forming the aluminum (Al) bit lines. Accordingly, the resistivity value of aluminum (Al) can be lowered by 47% compared to tungsten (W).

Furthermore, as the resistivity value of aluminum (Al) is lowered, the sheet resistance Rs of the bit line can be reduced without an increase or decrease in the thickness of the bit line.

Furthermore, as the sheet resistance Rs reduces, a RC delay problem can be solved because the coupling capacitance value is not increased.

Although the foregoing description has been made with reference to a specific embodiment, changes and modifications may be made by one of ordinary skill in the art without departing from the spirit and scope of the invention.

What is claimed is:

1. A method of manufacturing a semiconductor device, comprising the steps of:

forming an interlayer insulating layer, a lower barrier metal layer, a metal layer having a low resistivity value, an upper barrier metal layer, a first oxynitride layer, a hard mask layer formed at low temperature, a second oxynitride layer, and an organic Bottom Anti-Reflective Coating (BARC) layer over a semiconductor substrate;

etching the BARC layer, the second oxynitride layer, and the hard mask layer; and etching the first oxynitride layer, the upper barrier metal layer, the metal layer, and the lower barrier metal layer by using the hard mask layer as a mask.

2. The method of claim 1, comprising forming the metal layer from aluminum (Al).

3. The method of claim 1, comprising forming the hard mask layer using an amorphous carbon layer at a temperature of 200° C. to 500° C.

4. The method of claim 1, comprising forming the hard mask layer to a thickness of 1000 angstroms to 2000 angstroms.

5. The method of claim 1, comprising performing the etch process of the first oxynitride layer, the upper barrier metal layer, the metal layer and the lower barrier metal layer in-situ.

* * * * *